United States Patent
Larsen et al.

(10) Patent No.: US 6,851,013 B1
(45) Date of Patent: Feb. 1, 2005

(54) FAST PROGRAM MODE

(75) Inventors: Peter T. Larsen, Citrus Heights, CA (US); Lance W. Dover, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/464,298

(22) Filed: Dec. 15, 1999

(51) Int. Cl.[7] .............................................. G06F 12/00
(52) U.S. Cl. ............. 711/103; 365/185.33; 365/189.07; 365/239; 365/236; 711/154; 711/218; 711/219
(58) Field of Search .................................. 711/103, 154, 711/167, 218–219, 104; 365/198, 185.33, 189.07, 218, 221, 236, 239, 238.5; 712/37; 710/32, 35; 717/168, 174; 709/227–228

(56) References Cited

U.S. PATENT DOCUMENTS

| 4,620,277 | A | * | 10/1986 | Fisher et al. ................ 711/218 |
| 5,400,389 | A | * | 3/1995 | Niiyama et al. ............. 455/418 |
| 5,729,503 | A | * | 3/1998 | Manning .................. 365/233.5 |
| 5,778,440 | A | * | 7/1998 | Yiu et al. .................... 711/154 |
| 5,890,192 | A | * | 3/1999 | Lee et al. .................... 711/103 |
| 5,963,504 | A | * | 10/1999 | Manning .................. 365/233.5 |
| 5,966,723 | A | * | 10/1999 | James et al. ................. 711/103 |
| 6,229,737 | B1 | * | 5/2001 | Walukas ................ 365/185.33 |
| 2002/0133665 | A1 | * | 9/2002 | Mailloux et al. ........... 711/105 |

* cited by examiner

*Primary Examiner*—Denise Tran
(74) *Attorney, Agent, or Firm*—Shireen I. Bacon

(57) ABSTRACT

A method of programming a memory. The method of one embodiment calls for sending a command to a memory device. The command requests the memory device to enter a program mode. A confirmation of the command is sent. A first address is sent to the memory device. A first packet of data is also sent to the memory device. The first packet of data is to be programmed at the first address. A first write signal is sent to the memory device. A second packet of data is sent to the memory device. A second write signal is sent to the memory device.

9 Claims, 7 Drawing Sheets

FAST PROGRAM MODE

FIELD OF THE INVENTION

The present invention relates generally to the field of computers and computer systems. More particularly, the present invention relates to a fast program mode for flash memory.

BACKGROUND OF THE INVENTION

Many of today's computing applications such as cellular phones, digital cameras, and personal computers, use non-volatile memories to store data or code. Nonvolatility is advantageous because it allows the computing system to retain its data and code even when power is removed from the computing system. Thus if the system is turned off or if there is a power failure, there is no loss of code or data.

One example of a nonvolatile memory device is the flash Electrically Erasable Programmable Read-only Memory (flash EEPROM or flash memory). Flash memory can be programmed by the user, and once programmed, the flash memory retains its data until the memory is erased. Electrical erasure of the flash memory erases the contents of the memory of the device in one relatively rapid operation. The flash memory may then be programmed with new code or data.

Flash memory customers often use programming equipment such as device programmers, automatic-test-equipment (ATE), and Joint Test Action Group (JTAG) programmers to program the memories. This equipment has hardware and software operating system overhead associated with sending programming information to the flash memory. The overhead, which provides time for the equipment to setup addresses and control signals, can range from 12 microseconds ($\mu s$) to 180 $\mu s$ per byte/word or higher, depending on the equipment used.

Word or byte program operations in flash memory devices are typically executed by a multi-cycle command sequence. A 'Program Set-up' command is issued, followed by a second write that specifies the address and data. Control logic in the flash device, such as a Write State Machine (WSM), then takes over, controlling the program and program verify algorithms internally. While the WSM is working, the device can automatically enter 'Read Status Register' mode and remain there after the word/byte program is complete. The completion of the program event is indicated in status register. The status register can also indicate any errors.

FIG. 1 is flow diagram of typical program command sequence 100 of a prior art implementation. At step 110, the user sends a program command ('Program Set-up') and a program address to the flash memory. The 'Program Set-Up' command sets the Command User Interface (CUI) into a state such that the next write will load the address and data registers. The program address is the memory location to which the user wishes to write. The control logic in the memory receives that information and configures itself for program mode. The next write to the flash memory device after the 'Program Set-Up' command will cause the logic to latch the address and data and to begin the program algorithm. Then at step 120, the user sends the program data and the program address again. The control logic takes the data and program address and performs the program operation at the appropriate address in the memory array. The flash device switches to a read status mode where the device can output status register data. The user queries the status register at step 130. If the status register indicates that the program operation is not done, then the user waits and continues to poll the status register value. If the status register indicates that the program operation is done at step 130, the user can also check to see if the program was successful at step 140. For example, one possible cause of an unsuccessful program is incorrect program voltage. At step 150, the user decides whether there are more addresses to program. If there are, then the steps 110 through 150 have to be repeated.

FIG. 2 is a timing diagram 200 showing the relationship between the signals used in connection with the prior art program command sequence of FIG. 1. The timing diagram 200 includes six separate program sequences 210, 220, 230, 240, 250, 260. For this example, each program operation 210, 220, 230, 240, 250, 260 programs data to a different program address. In order to understand the operation of the program sequence 100 of FIG. 1, the operation of a single program operation 220 including the time periods T4, T5, and T6 will be discussed. FIG. 2 shows the signals referred to as ADDRESS 202, WRITE ENABLE 204, DATA 206, and STATUS 208 associated with the program sequence 100.

At time T4, the flash memory device is set up for programming as described above at step 110 of FIG. 1. Program address PA 221 is sent on the address bus ADDRESS 202 to the memory. The program command 225 is sent on the data bus DATA 206 to the control logic on the flash device. When the user is driving the program command 225 and the desired program address PA 221, WRITE ENABLE 204 is toggled. The WRITE ENABLE pulse 223 initiates the program and informs the control logic that an operation is requested. The control logic can read the command on DATA 206 and determine that a program is to occur at PA 221. The control logic prepares the flash memory for a program operation.

Then at time T5, the user sends the program address 222 and program data 226 to the flash memory. For this example, the first program address 221 and the second program address 222 are the same. At time T6, the user toggles WRITE ENABLE 204. This WRITE ENABLE pulse 224 causes the actual program to occur. The control logic uses the program address 222 and the program data 226 to program the appropriate address in the memory array.

During time T6, the user also polls the value on STATUS 208 to check the progress of the program operation. When STATUS 208 pulses to a logic high value, the program of data 226 to address 222 is complete. Other values in STATUS 208 can indicate a program failure.

The other instances 210, 230, 240, 250, 260 of the program operation are conducted in a similar fashion as that of the above described operation 220. Each program needs to have the program set up in order to a program an address. Hence, when more than one address location needs to be programmed, the program set up has to be repeated for each program operation. The signal setup time can become quite burdensome. A large amount of the time may not be consumed by the actual programming of the memory cells, but in setting up the memory device to enter program mode. Such overhead costs time and money to manufacturers and users.

SUMMARY OF THE INVENTION

A method of programming a memory is described. The method of one embodiment calls for sending a command to a memory device. The command requests the memory device to enter a program mode. A confirmation of the command is sent. A first address is sent to the memory device. A first packet of data is also sent to the memory device. The first packet of data is to be programmed at the first address. A first write signal is sent to the memory device. A second packet of data is sent to the memory device. A second write signal is sent to the memory device.

Other features and advantages of the present invention will be apparent from the accompanying drawings and from the detailed description that follow below.

BRIEF DESCRIPTION OF THE DRAWINGS

The present invention is illustrated by way of example and not limitations in the figures of the accompanying drawings, in which like references indicate similar elements, and in which.

DETAILED DESCRIPTION

A method for a fast program mode is disclosed. The described fast program mode is used to program and update code and/or data in nonvolatile writable memory, but is not so limited. Although the following embodiments are described with reference to nonvolatile writable memories and flash memory, other embodiments are applicable to other type of memory devices. The same techniques and teachings of the present invention can easily be applied to other types of circuits or semiconductor devices that have program operations or code/data updates.

Flash memories are often used in handheld computers and similar devices as both read only memory and as long term storage which may be both read and written. One feature of flash memory is the ability to be programmed, erased, and later reprogrammed. The memory can be programmed by a manufacturer with certain code or data at the factory. If the information changes or needs to be updated, a user can erase the existing information and store new information.

Furthermore, the block architecture of certain flash devices allows a user to erase and update only certain blocks or the entire chip. However, if a user wanted to program the entire memory space of a large flash memory device such as a 16 or 32 megabit part, writing the entire memory array can take a long time. Programming time is also an issue for manufacturers since programming time directly affects product costs. The longer it takes to program devices, the greater manufacturing costs.

Improving the programming command sequence can lead to improved programming times. This can provide quicker programming throughput that can lead to savings in time and money in the manufacturing flow. Manufacturers and consumers often need to write a large amount of data to sequential addresses. These consecutive program addresses present an opportunity to optimize the program operation. By reducing the signal setup required for consecutive program operations, program time can be reduced overall.

Embodiments of the fast program mode can facilitate an improvement in programming times. The fast program mode of the present invention bypasses the programmer system overhead by managing some of the address and control signals internally in the flash memory. This fast program mode provides a way to program flash memories quicker than existing programming methods via silicon enhancements. Other embodiments can provide an increase in clock frequency such that overall manufacturing throughput and efficiency are improved.

Figure 3:
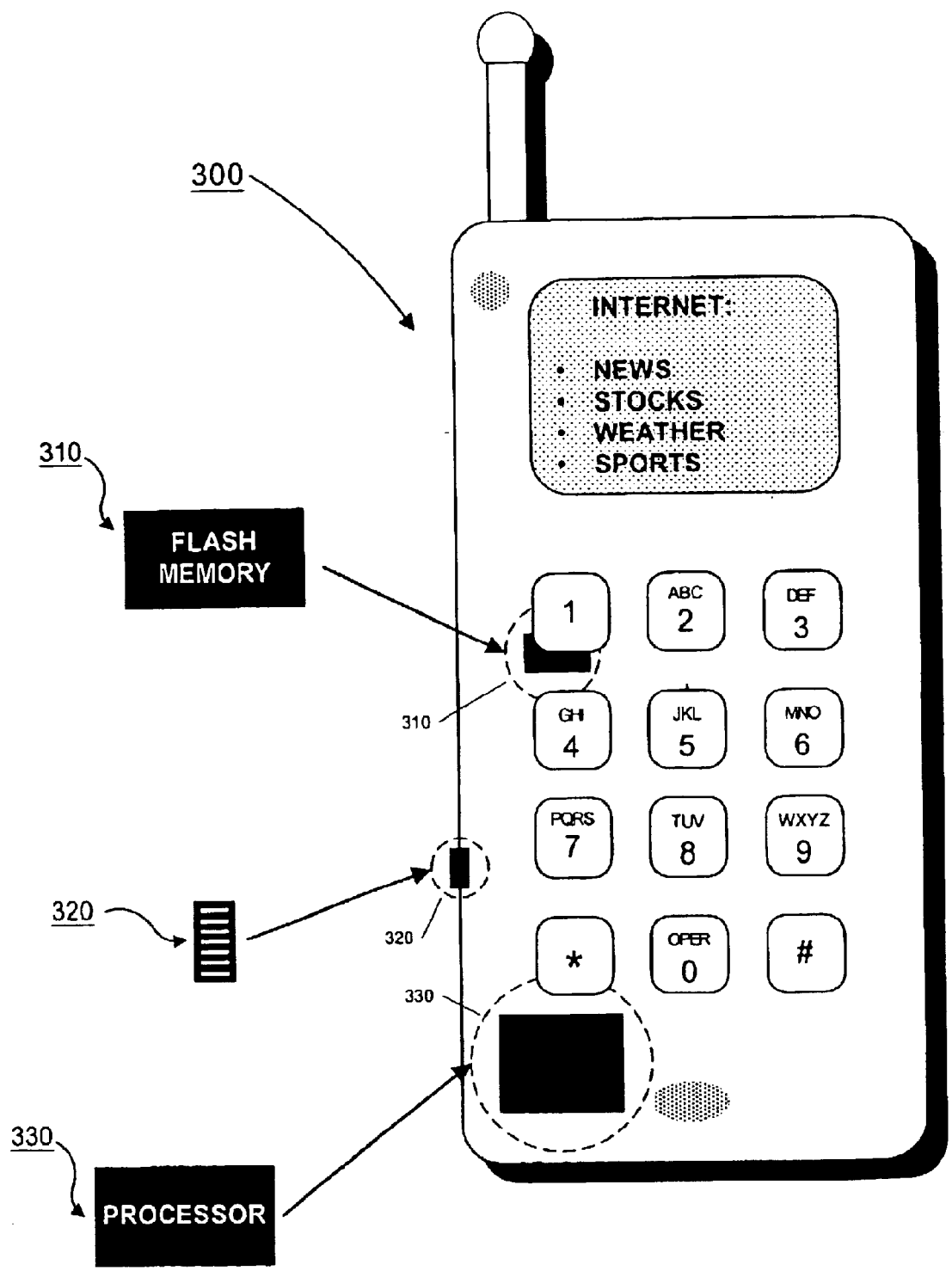
FIG. 3 is an example of a cellular telephone using a flash memory device.

Referring now to FIG. 3, there is an example of a cellular telephone 300 using a flash memory device 310. The cellular telephone 300 shown in FIG. 3 is a digital phone capable of Internet access. For example, a user can download and receive information from the Internet via cellular access. This cellular phone 300 can be a Personal Communications Service (PCS) phone using digital cellular technology such as Code-Division Multiple Access (CDMA), Time Division Multiple Access (TMDA), or Global System for Mobile (GSM) Communications. Similarly, flash memory can also be used in analog type cellular phones. Thus, the present invention is not limited to any specific combination of hardware circuitry and software.

Flash memory 310 and a processor 330 are located within cellular phone 300. Flash memory 310 has been designed to include a fast program mode. Processor 330 can be an embedded processor or a digital signal processing (DSP) chip. The phone 300 of FIG. 3 also includes a access port 320. Access port 320 can be used to physically link the phone 300 to an external system for code and/or data update. For instance, the flash memory can be updated through the access port interface or through a download via cellular transmission.

A memory update via the access port 320 is an example of an in-system write. In-system write utilizes the system processor 330 to execute flash memory erase and program algorithms. An engineer creates erase, program and verify algorithms and then downloads these algorithms into the system random access memory (RAM). The processor 330 executes the algorithms and ports code to the flash memory 310 for updates. In-system write is also a way to perform PC BIOS code updates.

The present invention is not limited to cellular phones. Alternative embodiments of the present invention can be used in other types of devices such as handheld devices and embedded applications. Some examples of handheld devices include Internet Protocol devices, digital cameras, personal digital assistants (PDAs), and handheld PCs. Embedded applications can include a microcontroller, a digital signal processor (DSP), system on a chip, network computers (NetPC), set-top boxes, network hubs, wide area network (WAN) switches, or any other system which uses flash memory for other embodiments. Flash memory is also used in personal computers (PC) and other computer systems.

For another embodiment of a system, one implementation of a memory including a fast program mode can be used with a system on a chip. One embodiment of a system on a chip comprises of a processor and a memory. The memory for one system is a flash memory. The flash memory can be located on the same die as the processor and other system components. Additionally, other logic blocks such as a memory controller or graphics controller can also be located on a system on a chip. By including one embodiment of the present invention on the system on a chip, the flash memory can be updated quickly and with minimal inconvenience to a user.

There are a number of ways in which manufacturers can program flash memories. Typical solutions include on-board programming and off-board programming. On-board programming (OBP) loads code/data into the flash memory component after the device has already been mounted onto the printed circuit board (PCB). There are multiple methods to perform OBP. OBP methods include using Automatic-Test-Equipment (ATE), IEEE 1149.1 Joint Test Action Group (JTAG) test access port (TAP), in-circuit programming, and in-system write.

Off-board programming means that operators load code/data into individual memory components away from the product assembly and test processes. Manufacturers then mount the pre-programmed components on PCBs. Off-board programming equipment ranges from device programmers to automatic handling systems. Typically equipment operators manage product flow through off-board programmers. Off-board programming can include the use of an engineering programmer, a production programmer, or a Automated Programming System.

In response to consumer electronic demands, flash memory package sizes continue to get smaller and smaller. With the shrinking flash memory package, OBP is an appealing method to load code into the flash memory component. OBP allows for hands-free programming. Manufacturers use surface mount assembly equipment to mount blank flash memory components on the PCB. Once mounted, OBP provides hands-free programming. But in order to perform OBP, the test equipment needs to be able to access all of the flash memory component's pins. This method works well if there is sufficient area on the PCB to connect to all flash memory pins. In other cases, where PCB component pins are inaccessible, serial OBP is an option.

JTAG programming is one type of OBP. JTAG is one solution for products that do not have enough space available on the PCB to connect a tester interface to every flash memory pin. The JTAG TAP provides the capability to program flash memory mounted on the PCB. To perform JTAG programming you need to connect a JTAG compliant device to all of the flash memory pins.

Many cellular telephone manufacturers use JTAG programming to load code into the flash memory component. Cellular telephone PCBs are so small that other OBP methods that require access to all the flash memory pins would be difficult to accomplish. Because JTAG uses a serial interface, this OBP method utilizes little PCB area and fits the needs of space-constrained products. In order to perform OBP, cellular telephone manufacturers use the four-wire JTAG interface. These manufacturers load code into the flash memory component on millions of telephones per year.

Figure 4:
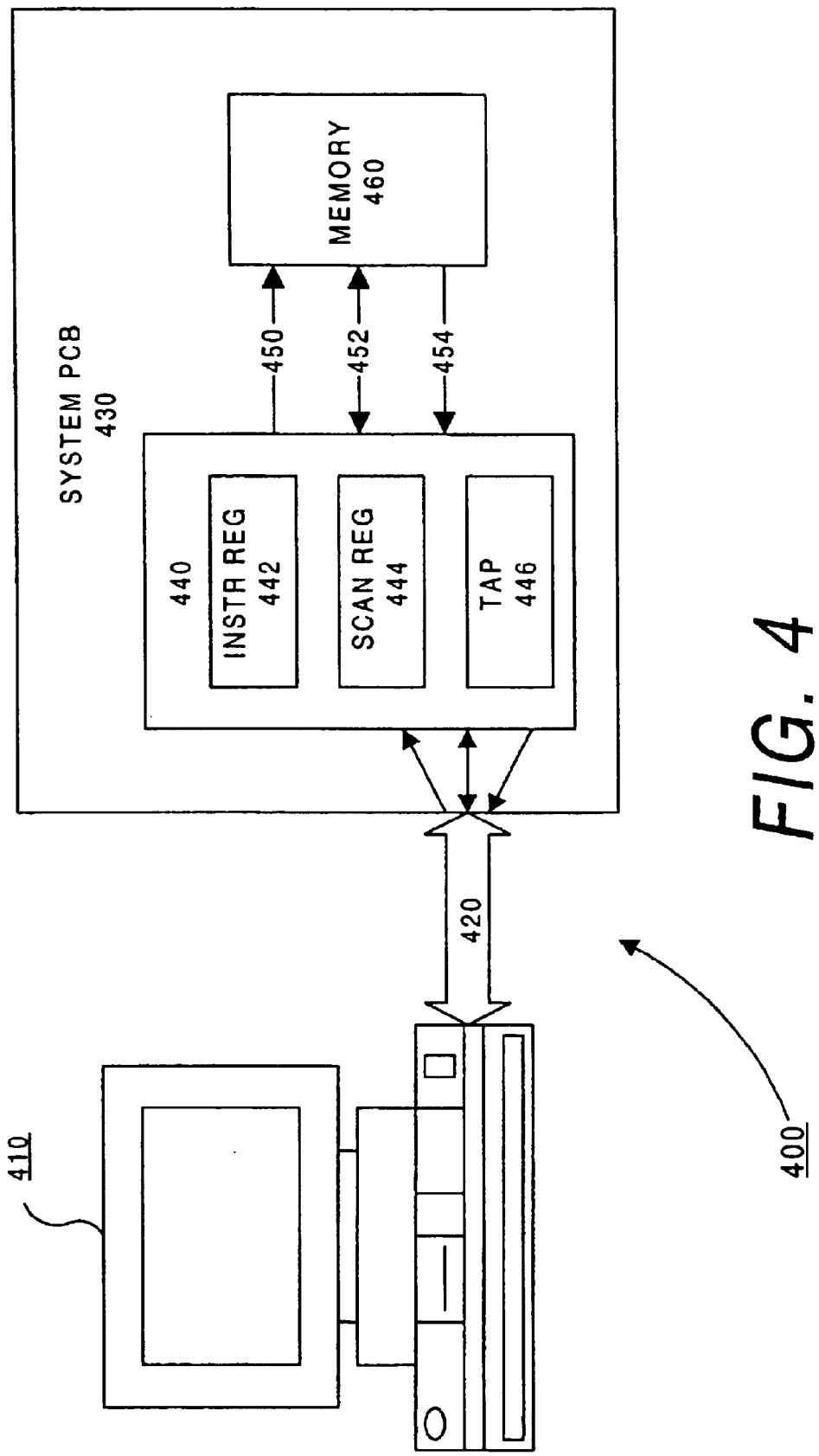
FIG. 4 is one embodiment of a system for performing on-board programming of a flash memory.

FIG. 4 is one embodiment of a system for performing on-board programming of a flash memory 460. The environment 400 of FIG. 4 includes a computer system 410 and a system PCB 430. System PCB 430 includes a JTAG compliant device 440 coupled to a memory 460. The computer 410 is coupled to the system PCB 430 via a JTAG interface 420. Communication with the JTAG compliant device 440 is performed through a hardware controller that either inserts into a PC add-in card slot on the computer 410 or by using a stand-alone programmer.

The JTAG compliant device 440 includes an instruction register 442, a boundary-scan register (BSR) 444, and a test access port (TAP) 446. The TAP controller 446 provides access to many of the test support functions built into the JTAG compliant device 440. The TAP 446 is a state machine that controls all operations for one JTAG compliant device 440. A single cell of a shift-register is designed into the logic of the JTAG compliant device 440. Every digital pin of the memory 460 is coupled to its own shift register cell. This single cell, known as the boundary-scan cell (BSC), links the JTAG circuitry to the memory's internal core logic. All BSCs of a particular circuit constitute the BSR 444. BSR logic becomes active when performing JTAG testing.

The JTAG compliant device 440 connects to all flash memory address data, and control signals 450, 452, 454. The flash memory 460 does not need to be JTAG compliant for this programming method to function. The JTAG hardware controller sends commands and data to the JTAG compliant device 440 which then propagates the information to the flash memory 460 for programming.

JTAG hardware controllers provide a communication link with any JTAG compliant device. A manufacturer can create software to perform OBP programming functions. Some type of program is often used to control the programming operation through the computer 410. The program can offer users a simpler interface to accessing the memory 460 without having to remember all the necessary signal timing. So if a person desired to perform OBP via the JTAG TAP using the fast program mode with a memory 460 capable of such a programming mode, the person may need to write the software routines and program necessary to enable the computer 410 or stand-alone programmer. The program code of such routines can be stored in the computer memory of the system 410 or on magnetic disk media.

Although this example describes the storage of program code in computer memory and on magnetic disk media, program code can be stored on other forms of a machine-readable medium. Some machine-readable mediums for storing program code include optical storage media, flash memory devices, PC Cards, etc. Similarly, program code can also be distributed by way of other machine readable mediums. For instance, a computer program may be distributed through a machine readable medium such as a floppy disk, a CD ROM, a carrier wave, or even a transmission over the internet.

Thus, a machine-readable medium can include any mechanism for storing or transmitting information in a form readable by a machine (e.g., a computer). For example, a machine-readable medium can include a read only memory (ROM), random access memory (RAM), magnetic disk storage media, optical storage media, flash memory devices, and electrical, optical, acoustical or other forms of propagated signals (e.g., carrier waves, infrared signals, digital signals, etc.).

Another method for programming flash memory devices involves the use of off-board programmers. Manufacturers use off-board programmers to load code into individual flash memory components before mounting the components on the PCB.

Engineering programmers drive erase, program, and verify signals to individual flash memory components. Engineers typically use device programmers during the prototype stage to load code into the flash memory component. In this stage of product development, code frequently changes. Because of these changes engineers need easy access to the flash memory component. Engineers often mount the flash memory component in a socket on the prototype PCB. They can then remove the flash memory component from the socket, reprogram it in the engineering programmer, and then reinstall the component into the socket to test the latest revision of code.

Production programmers provide capability to load code into many components simultaneously. There are two types of production programmers: gang and concurrent. Some gang programmers can load code/data into 8, 10, 16, or 20 flash memory components at one time. The number of components depends on the number of sockets the programmer supports. Gang programmers often support manufacturing environments where high volume programming is required. Because these programmers support manufacturing operations, manufacturers pay close attention to programming times. Concurrent programmers are similar to gang programmers. They also support multiple sockets. One difference between a concurrent programmer and a gang programmer is that the concurrent programmer programs each socket individually.

Figure 5:
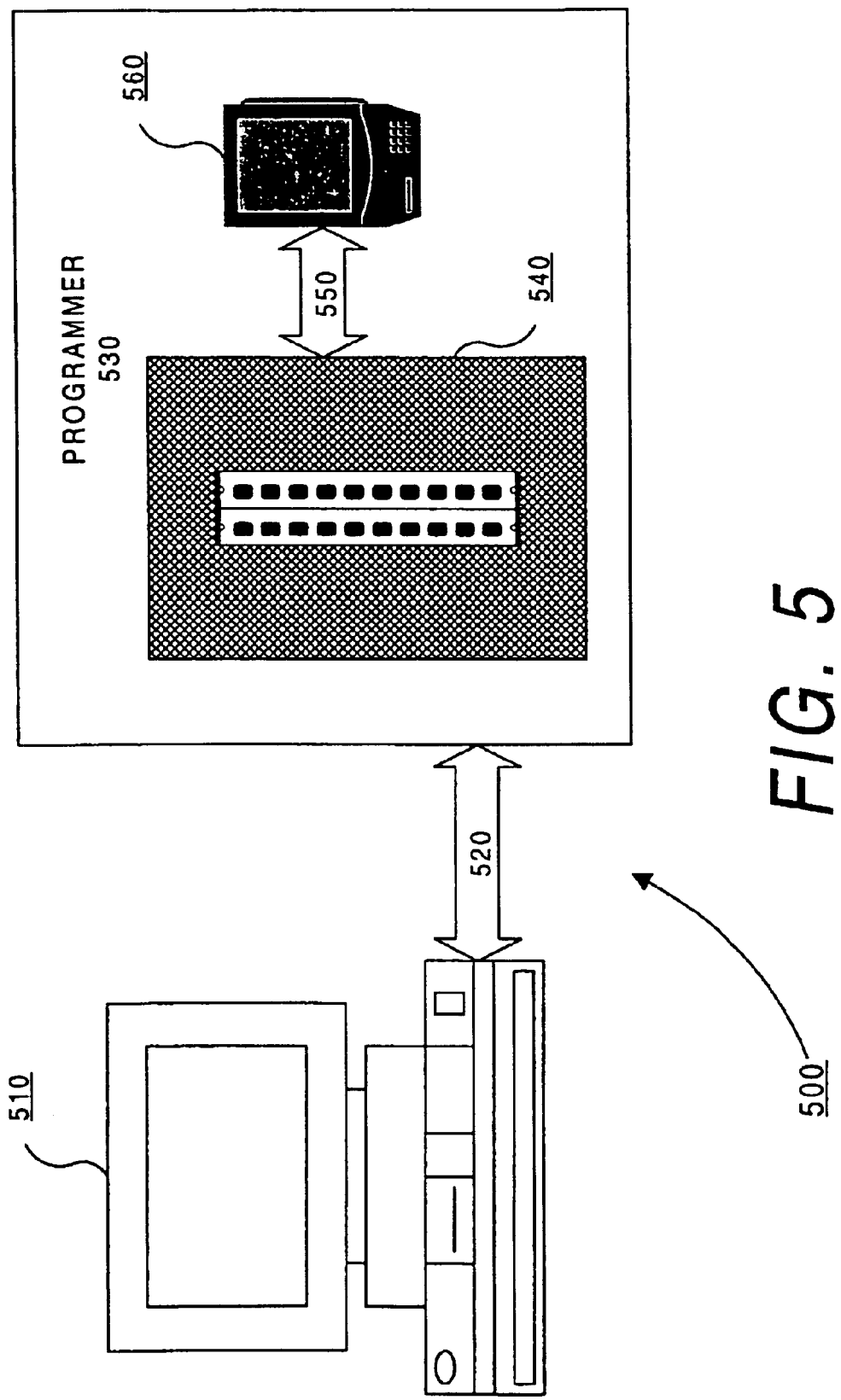
FIG. 5 is one embodiment of a system for performing off-board programming of a flash memory device.

FIG. 5 is one embodiment of a system for performing off-board programming of a flash memory device. The environment 500 of FIG. 5 includes a computer system 510 and a programmer 530. The computer system 510 and the programmer 530 are coupled together in this embodiment via a parallel or serial cable 520. For an alternative embodiment, the programmer can be a stand-alone programmer that does not require the assistance of a computer 510. The programmer 530 of this embodiment includes a plurality of sockets 540 into which flash memory components can be inserted for programming. This embodiment also includes a user interface 560. The interface 560 has a keypad and a display through which a user can perform program, erase, and read operations on components in sockets 540. User interface 560 is coupled to the sockets via cables and wires 550.

Although the above examples describe programming flash memory components with off-board programmers and on-board programmers, it will be evident that alternate embodiments of the present invention can be included in other systems. For example, memory devices can also be programmed with a system such as a computer system, PDA, cellular phone, set-top box, or network hub having an implementation of the present invention.

Figure 6:
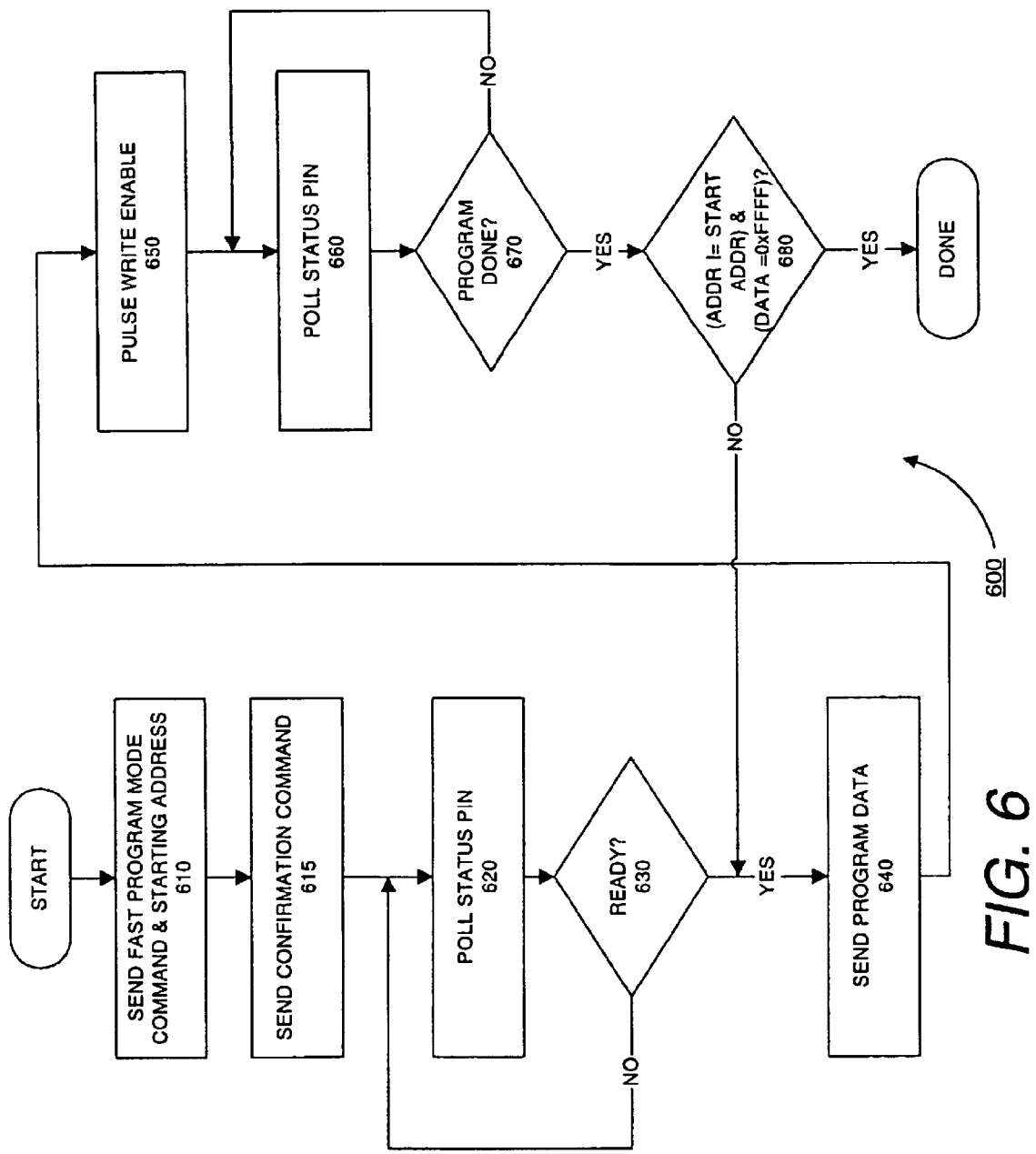
FIG. 6 is a flow diagram of a fast program command sequence of one embodiment.

Referring now to FIG. 6, there is a flow diagram 600 of a fast program command sequence of one embodiment. At step 610, the user sends a fast program mode command ('Fast Program Mode') and a program address to the flash memory. For this embodiment, the user also sends a 'Fast Program Mode' confirmation command at step 615 to confirm that the mode is to be entered. The 'Fast Program Mode' and 'Fast Program Mode' confirmation commands cause the component to configure itself for receiving a series of data packets and to program these packets to sequential memory locations. This start address is latched within the component. The start program address is the first memory location to which the user wishes to write.

Unlike prior art flash memory devices, this embodiment of the fast program mode of the present invention automatically outputs the contents from a status register in the flash memory device to a designated output pin. Prior art flash devices require the user to perform some operation to read the contents of a status register. Performing that status operation consumed additional time, thus slowing the program process. By automatically outputting the status of the program operation in the fast program mode of the present invention, some time is saved.

At step 620, the user polls a status pin to determine whether the component has entered the fast program mode and ready to start receiving data. For this embodiment, the status value is outputted to a single status pin. Alternate embodiments of the present invention can output status values to multiple pins. If the flash device is ready at step 630, then the user can proceed to send program data. But if the flash device is not yet ready, the user should wait and continue to poll the status pin.

If the component is ready to receive data, then the user sends a first data packet at step 640. Data packets sent to the component in later program operations following the first one will be programmed at the next byte or word location following the starting address. A write enable pulse to the flash component at step 650 causes the actual program algorithm to occur. The internal flash control logic also increments this latched address to point to the next byte or word location for each successive write. Each time a write enable signal is sent to the flash component, logic in the flash device latches the data and programs that data to the incremented address location in the memory array.

As the control logic in the flash device is performing the program operation in the memory array, the user can poll a status pin at step 660. If the value on the status pin indicates that the program operation is not done yet at step 670, then the user waits and continues to poll the status pin value at step 660. If the status value indicates that the program operation is done, the user can either terminate the fast program mode or send the next packet of data to be programmed.

If the user has finished programming all the data or wants to terminate the fast program mode, the externally supplied address value that is driven to the flash component is changed to a value other than that of the first program address. Furthermore, the data value driven on the data bus to the component is changed to all 1's (or 0xFFFF in this example). Upon the next write enable pulse at step 680, the control logic in the flash device will read this new address and data. When the logic decodes this information, the logic determines that the mode should be terminated. But if the user wants to continue programming data, the user should keep driving the first address on the address bus to the component and simply send new program data at step 640. The next write enable pulse 650 will cause the new data to be programmed at the next sequential address in the memory array. Steps 640 through 680 are repeated until the all desired sequential programming operations are done.

For another embodiment of the fast program mode, the mode can be designed to get the code or data into the flash memory as quickly as possible. Therefore, no internal data integrity checking within the flash device occurs in this mode. When the fast program mode is finished, the user can performed an external verify to check that the data was properly programmed into the flash memory. If the verify operation finds an error then the fast program mode can be reentered and the memory location that failed can be reprogrammed.

Figure 7:
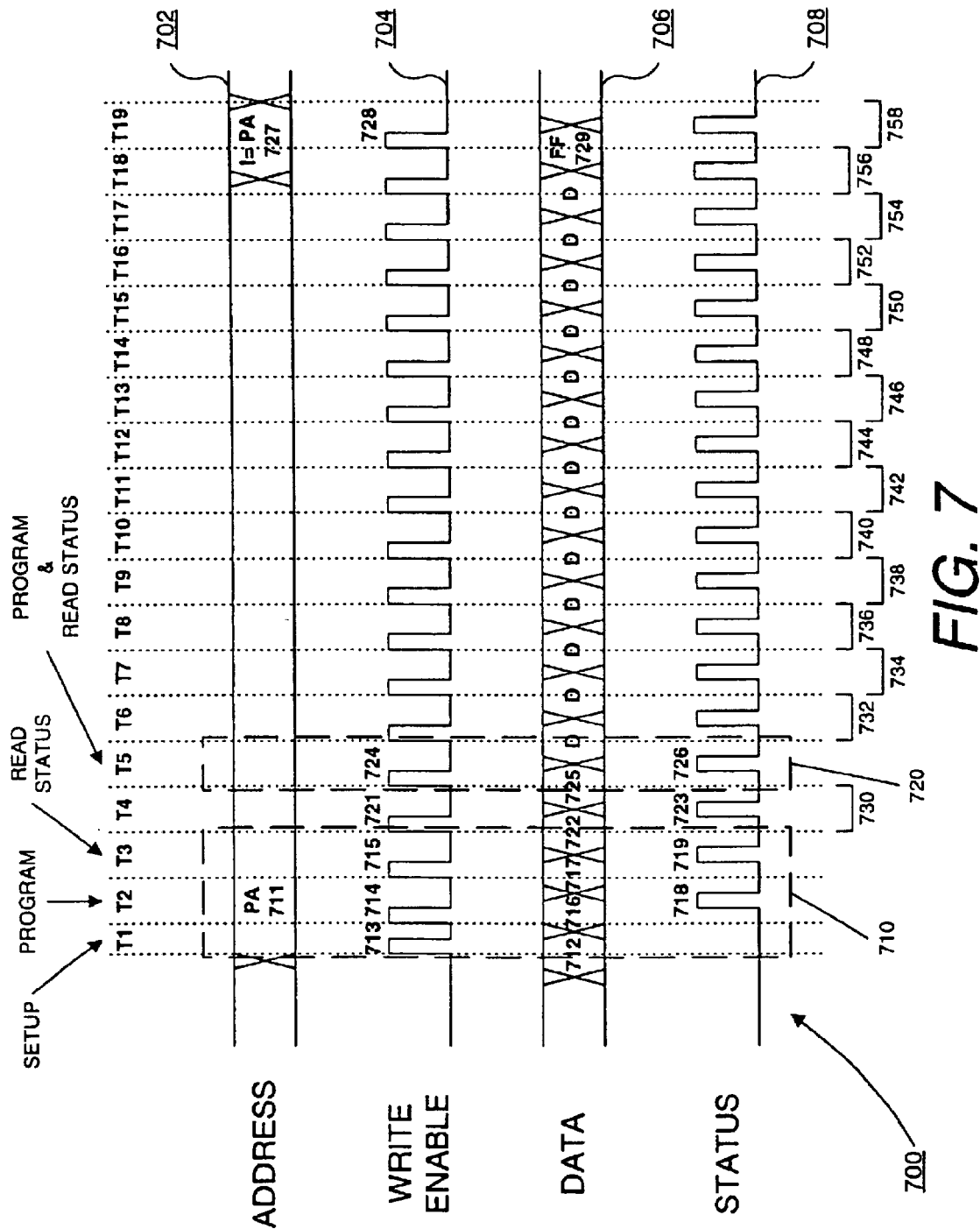
FIG. 7 is a timing diagram showing the relationship between the signals used in connection with the fast program command sequence of FIG. 6.

FIG. 7 is a timing diagram showing the relationship between the signals used in connection with the fast program command sequence of FIG. 6. The waveforms shown include address signals 702, a write enable signal 704, data signals 706, and status indicator 708. The timing diagram 700 shows sixteen program operations 710, 720, 730, 732, 734, 736, 738, 740, 742, 744, 746, 748, 750, 752, 754, 756. Operation 758 is a fast program mode termination command. For this example, these sixteen program operations 710, 720, 730, 732, 734, 736, 738, 740, 742, 744, 746, 748, 750, 752, 754, 756 occur at sequential addresses in the memory array. In order to understand the operation of the program sequences on timing diagram 700 of FIG. 7, the operation of three program operations 710, 720, 730 including the time periods T1, T2, T3, T4 and T5 will be discussed.

At time T1, the flash memory device is set up for a fast program mode as described at step 610 of FIG. 6. Program address PA 711 is sent on the address bus ADDRESS 702 to the memory. PA 711 is the starting address at which the first piece of data is programmed. Subsequent data packets will be programmed at byte or word increments from the starting address PA 711. The fast program mode command 712 is sent on the data bus DATA 706 to the control logic on the flash device. When the user is driving the fast program mode command 712 and the starting program address PA 711, logic that an operation is requested. The control logic decodes the command on DATA 706 and determines that a fast program is to occur at starting address PA 711. The control logic prepares the flash component to become configured for a fast program mode.

At time T2, the user issues a fast program mode confirmation command to enter into the fast program mode. The confirmation command in this example is a WRITE ENABLE pulse 714 on WRITE ENABLE 704 and the fast program mode confirmation command 716 on DATA 706. The user also continues to send starting address PA 711. For this embodiment, the starting address PA 711 has to be driven on ADDRESS 702 for the entire period during which the user wants to remain in the fast program mode.

The user queries STATUS 708 during time T2 to find out if the component has entered the fast program mode and is ready for programming to commence. The logic high 718 on STATUS indicates that the device is ready.

At the end of time T2, the user sends the data 717 to be programmed at PA 711. At time T3, the user toggles WRITE ENABLE 704. This WRITE ENABLE pulse 715 causes the actual program to occur. The control logic in the flash device uses PA 711 and data 717 to program the appropriate address in the memory array. The user polls the value on STATUS 708 to check the progress of the program operation. When STATUS 708 pulses to a logic high value 719, the program of data 717 to address PA 711 is complete. For this embodiment, the first program operation took three time period T1 through T3.

This example embodiment refers to pulses on WRITE ENABLE 704 and STATUS 708. However, the use of pulses is not required for alternative embodiments of the present invention. For example, the signals can be driven to certain levels and held there instead of being pulsed.

At T4, a pulse 721 on WRITE ENABLE 704 causes the logic to read the information on ADDRESS 702 and DATA 706. If the address is still PA 711, then the logic determines that the fast program mode is to be maintained and data 722 is to be programmed at the next consecutive byte or word address subsequent to PA 711.

The fast program mode of one embodiment uses the flash memory's internal write state machine (WSM) to automatically increment addresses during programming. The WSM can also manage the flash memory control signals chip enable, output enable, and others. For this embodiment, logic in the component stores the starting address in a register internally. The logic increments the address to determine the next consecutive address for the subsequent program operation. The logic uses this calculated address to program the memory array with data 722. Upon completion of the memory write, the component issues a pulse 723 on STATUS 708. The component is ready to receive new data or a termination command. Thus for this embodiment, a complete program operation has been accomplished during one time period T4.

At T5, WRITE ENABLE pulse 724 causes the logic to read the information on ADDRESS 702 and DATA 706. If data 725 is not equal to all 1's (0xFFFF in this example) and the address is still PA 711, then the logic determines that the fast program mode is to be maintained and data 722 is to be programmed at the next consecutive byte or word address subsequent to the address used to program data 722 during time T4. The logic uses this newly calculated address to program the memory array with data 725. Upon completion of the memory write, the component issues a pulse 726 on STATUS 708. The component is again ready to receive new data or a termination command. This program of data 725 has been completed in one time period T5.

The example embodiments described above include the use of pulses on certain signal lines such as WRITE ENABLE 704 and STATUS 708. However, alternative implementations of flash memories having embodiments of the present invention can use levels on signal lines instead of pulses. For example, certain NOR type flash memory parts include status levels on signal lines. The host machine or user polls the status pins on the flash device for a level. When the user sees a predetermined level on the signal, the user resumes some other action.

Figure 1:
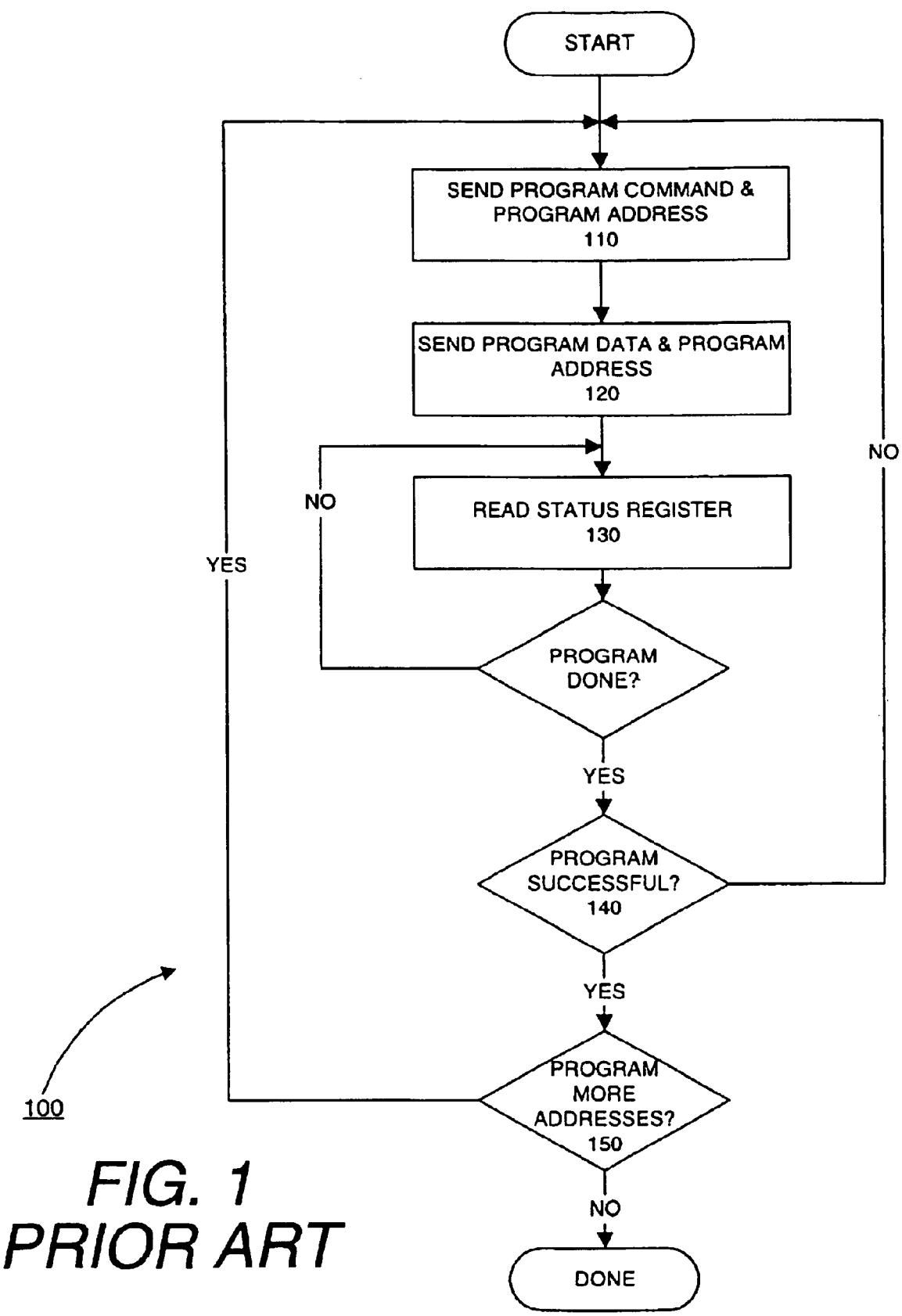
FIG. 1 is a flow diagram of a typical program command sequence of a prior art implementation.
Figure 2:
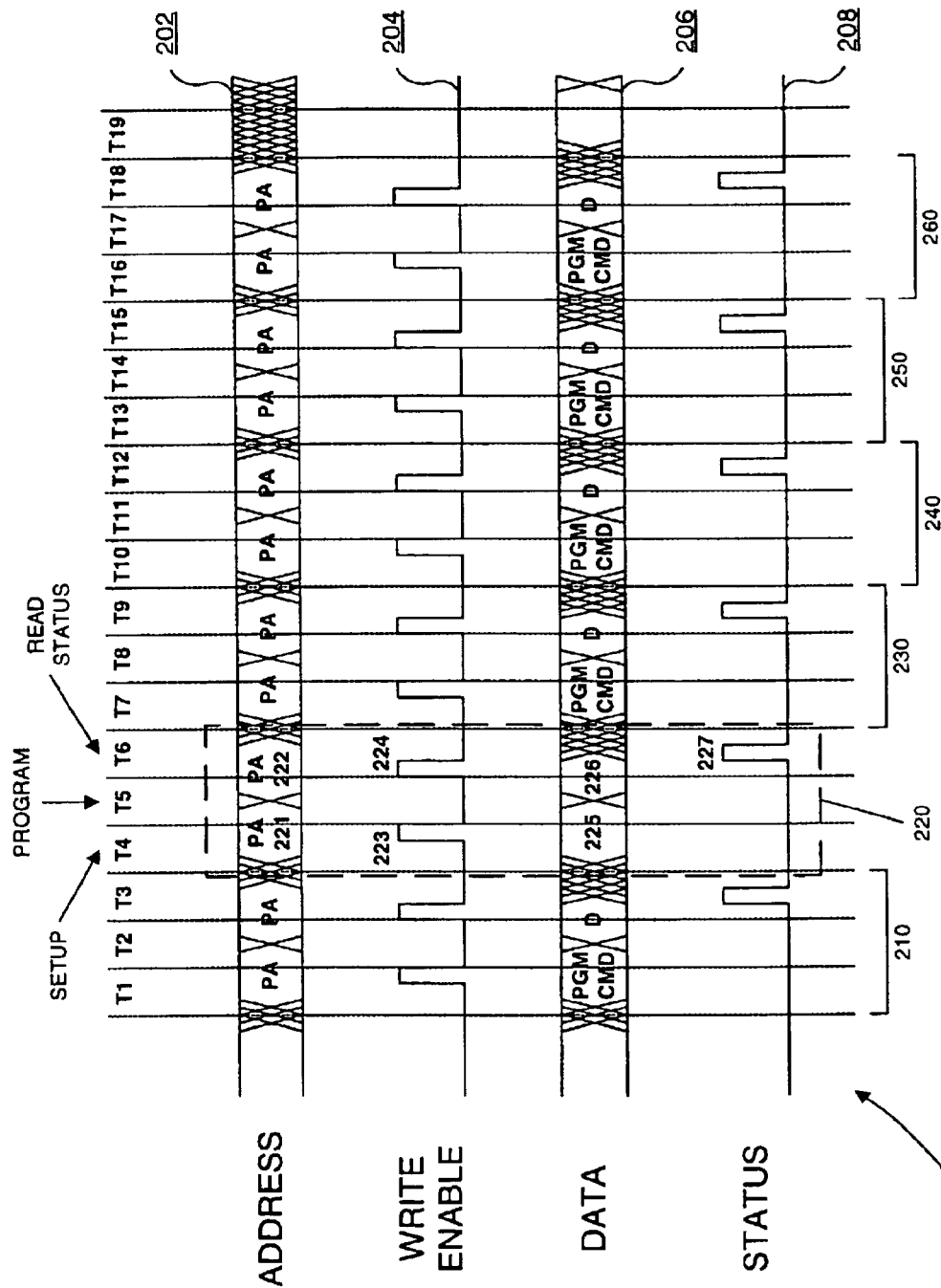
FIG. 2 is a timing diagram showing the relationship between the signals used in connection with the prior art program command sequence of FIG. 1.

A comparison of the method of the present invention and that of the typical prior act discloses the difference in time requirements. The prior art method of FIG. 1 and FIG. 2 needs a minimum of three bus cycles for each program operation. A host typically has to pull the flash part more than once to get the status. So three complete program operations required nine clock periods. But for this embodiment of the present operation in this embodiment of the present program operation needed three bus cycles. Subsequent program operations in this embodiment of the present invention only took one bus cycle each to complete. So a system using an embodiment of the present invention can have three program operations completed in five time periods. This is a savings of four clock periods. The larger the block of data that is used to program with the fast program mode, the greater the time savings over the prior art method.

Referring now to time period T19, the user terminates the fast program mode. For this embodiment, driving an address 727 different from the starting address PA 711 together with all 1's (0xFFFF 729 in this example) on DATA 706. The logic reads the values on ADDRESS 702 and DATA 706 when the user issues the WRITE ENABLE pulse 728. The logic terminates the fast program mode.

Although the value used on DATA 706 to indicate termination of the fast program mode for this embodiment is a value of all 1's, alternative implementations of the present invention can include values of all 0's or some other predetermined combination.

Eliminating the requirements for the programming equipment to manage addresses and control signals inherently allows quicker programming times. For instance, a theoretical example of improved programming times is described. A 32 megabit memory part can store 2,048,000 words of data. If a programmer takes 57 $\mu$s to program one word, then the total time needed to program the entire memory array is 2,048,000×57 $\mu$S=one minute and 55 seconds. But if the average time needed to program a word of data in a fast program mode is 25 $\mu$s, then the total time needed to program the same part with the same programmer is 2,048,000×25 µS=51 seconds. Considering the vast number of programmers available today, programming times can be significantly improved with the fast program mode because of the slow operating system overhead associated with many programmers.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A method comprising:

receiving a command to enter a fast program mode to program a first piece of data at a first address;

entering into said fast program mode;

programming said first piece of data at said first address in response to a pulse of a write signal;

checking whether termination of said fast program mode is indicated or if a second piece of data is to be written, wherein said checking further comprises detecting if an incoming address is different from said first address;

exiting said fast program mode if said termination of said fast program mode is indicated, else incrementing said first address to a second address; and programming said second piece of data at said second address in response to another pulse of said write signal.

2. The method of claim 1 further comprising receiving a confirmation command prior to entering said program mode.

3. The method of claim 2, further comprising automatically issuing a status value to indicate a status for said programming of said first piece of data.

4. The method of claim 3, wherein indication said termination comprises:

receiving an address unequal to said first address and a predefined data packet.

5. The method of claim 4 wherein said predefined data packet is comprised of all 1's.

6. The method of claim 4 wherein said predefined data packet is comprised of all 0's.

7. The method of claim 1, wherein said first piece of data is a packet.

8. The method of claim 1, wherein programming said first piece of data further comprises:

erasing the current contents of the first data address.

9. The method of claim 1, wherein programming said second piece of data her comprises:

erasing the current contents of the second data address.

* * * * *

UNITED STATES PATENT AND TRADEMARK OFFICE
CERTIFICATE OF CORRECTION

PATENT NO. : 6,851,013 B1
DATED : February 1, 2005
INVENTOR(S) : Larsen et al.

It is certified that error appears in the above-identified patent and that said Letters Patent is hereby corrected as shown below:

Column 9,
Line 17, before the first occurrence of "logic", insert -- WRITE ENABLE 704 is toggled --.

Column 10,
Line 33, delete "pull" and insert -- poll --.
Lines 36-37, delete "operation in this embodiment of the present" and insert -- invention, the first --.

Column 12,
Line 25, delete "her" and insert -- further --.

Signed and Sealed this

Twelfth Day of July, 2005

JON W. DUDAS
*Director of the United States Patent and Trademark Office*